United States Patent
Chacin et al.

(10) Patent No.: US 8,852,349 B2
(45) Date of Patent: Oct. 7, 2014

(54) WAFER PROCESSING HARDWARE FOR EPITAXIAL DEPOSITION WITH REDUCED AUTO-DOPING AND BACKSIDE DEFECTS

(75) Inventors: Juan Chacin, Palo Alto, CA (US); Roger Anderson, Sunnyvale, CA (US); Kailash Patalay, Santa Clara, CA (US); Craig Metzner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 851 days.

(21) Appl. No.: 11/521,856

(22) Filed: Sep. 15, 2006

(65) Prior Publication Data

US 2008/0069951 A1    Mar. 20, 2008

(51) Int. Cl.
  C23C 16/00    (2006.01)
  C23F 1/00     (2006.01)
  H01L 21/306   (2006.01)
  C23C 16/458   (2006.01)
  H01L 21/687   (2006.01)
  C23C 16/455   (2006.01)

(52) U.S. Cl.
  CPC ....... C23C 16/45521 (2013.01); C23C 16/4585 (2013.01); H01L 21/68735 (2013.01); H01L 21/68728 (2013.01)
  USPC ...................................... 118/728; 156/345.51

(58) Field of Classification Search
  USPC .............. 118/715, 724, 725, 728; 156/345.51
  See application file for complete search history.

(56) References Cited

U.S. PATENT DOCUMENTS

| | | | | |
|---|---|---|---|---|
| 5,288,327 A | * | 2/1994 | Bhat ............................. | 118/719 |
| 5,527,393 A | * | 6/1996 | Sato et al. ..................... | 118/725 |
| 6,632,277 B2 | * | 10/2003 | Dietze et al. .................... | 117/2 |
| 6,652,650 B2 | | 11/2003 | Yang et al. | |
| 2003/0029571 A1 | | 2/2003 | Goodman et al. | |
| 2004/0144323 A1 | | 7/2004 | Kai | |
| 2004/0149389 A1 | * | 8/2004 | Fink ......................... | 156/345.51 |
| 2004/0154544 A1 | * | 8/2004 | Strauch ........................ | 118/728 |
| 2005/0000449 A1 | | 1/2005 | Ishibashi et al. | |
| 2005/0193952 A1 | | 9/2005 | Goodman et al. | |
| 2008/0110401 A1 | | 5/2008 | Fujikawa et al. | |
| 2009/0314210 A1 | | 12/2009 | Ishibashi et al. | |

FOREIGN PATENT DOCUMENTS

JP    2003/197532 A    7/2003

OTHER PUBLICATIONS

International Search Report and Written Opinion mailed Dec. 2, 2008 for PCT Application No. PCT/US2008/078085.
German Office Action dated Mar. 13, 2009 for German Application No. 12999P-DE.
Office Action from the Korean Intellectual Property Office received Jan. 10, 2013 for Korean Patent Application No. (PCT) 10-2009-0098829.

\* cited by examiner

*Primary Examiner* — Maureen Gramaglia
(74) *Attorney, Agent, or Firm* — Moser Taboada; Alan Taboada

(57) ABSTRACT

According to one aspect of the invention, an apparatus for reducing auto-doping of the front side of a substrate and reducing defects on the backside of the substrate during an epitaxial deposition process for forming an epitaxial layer on the front side of the substrate comprising: a means for forming a wafer gap region between the backside of the substrate and a susceptor plate, having an adjustable thickness; a means for ventilating auto-dopants out of the wafer gap region with a flow of inert gas, while inhibiting or prohibiting the flow of inert gas over the front side of the substrate; and a means for flowing reactant gases over the surface of the front side of the substrate, while inhibiting or prohibiting the flow of reactant gases near the surface of the backside of the substrate.

40 Claims, 13 Drawing Sheets

WAFER PROCESSING HARDWARE FOR EPITAXIAL DEPOSITION WITH REDUCED AUTO-DOPING AND BACKSIDE DEFECTS

BACKGROUND OF THE INVENTION

1). Field of the Invention

Embodiments of the invention relate to the apparatus and method of using the apparatus for processing semiconductor substrates. In particular, the apparatus and method of using the apparatus for the deposition of an epitaxial semiconductor layer with reduced auto-doping and backside defects.

2). Background

FIG. 1A relates to an epitaxial processing apparatus 100 that may be used for epitaxial deposition. Substrate 102, which may be heated by upper heat lamps 106, is positioned over a susceptor 104, which may be heated by lower heat lamps 107. Upper dome 108 and lower dome 109, which may be quartz, enclose the processing chamber 113. Lift arms 101 and susceptor arms 105 move so as to separate from each other, thus separating the substrate 102 from the susceptor 104, and so as to position the processed substrate 102 to be removed from the processing chamber 113 by a robot (not shown) and replaced by an unprocessed substrate 102.

The epitaxial deposition of a low doped semiconductor layer on a highly doped substrate may often result in substantial auto-doping of the epitaxial low doped layer. Referring to FIG. 1B, during a high temperature epitaxial deposition process, dopant from the backside of the substrate 102 may diffuse out of the substrate 102 and into the wafer-susceptor gap 112. With a build-up of dopant in the wafer-susceptor gap 112, some dopant may migrate around the edge of the substrate 102 to the topside of the substrate 102, where the epitaxial layer is being formed. This phenomena is known as auto-doping 110 and results in the auto-dopants 110 mixing into the epitaxial layer being formed, particularly near the edge of the substrate 102. FIG. 1C demonstrates the auto-doping effect on resistivity 111. The extra auto-dopants 110 result in lowering the resistivity of the epitaxial layer near the edge, thus limiting the maximum resistivity of the epitaxial layer that may be formed on a highly doped substrate 102. This problem is particularly acute when boron is the dopant in a highly doped P+ substrate 102.

Oxidizing the backside of the substrate 102 may help seal the backside of the P+ substrate 102, thus reducing the out-diffusion of dopant into the wafer-susceptor gap 112. Back-sealing may be effective, however this approach may be expensive because the oxide must be deposited and then removed, thus requiring at least two extra steps.

Another approach involves lowering the processing temperature during the epitaxial deposition process, thus substantially lowering the out-diffusion of dopant into the wafer-susceptor gap 112. Although this approach may be effective in reducing auto-doping, it also substantially reduces the rate of epitaxial growth on the substrate 102, thus substantially reducing throughput.

One approach involves adding more dopant to the middle of the wafer to provide a more uniform resistivity across the entire wafer. However, this process is only effective for the deposition of a low resistivity epitaxial layer. The process is limited to an epitaxial layer in the range of only about 1.5 to 3.0 ohms/sq.

SUMMARY

The present invention is related to an apparatus for reducing auto-doping of the front side of a substrate and defects on the backside of the substrate during an epitaxial deposition process for forming an epitaxial layer on the front side of the substrate. In embodiments, the substrate may be heavily doped. In embodiments, the substrate may comprise heavily doped single crystal silicon or single crystal silicon-germanium material. In embodiments, the epitaxial layer may comprise lightly doped single crystal silicon or single crystal silicon-germanium material. Embodiments may comprise: a means for forming a wafer gap region having an adjustable thickness, wherein the wafer gap region may comprise a region between the backside of the substrate and a susceptor plate; a means for ventilating auto-dopants out of the wafer gap region with a flow of inert gas, while inhibiting or prohibiting the flow of inert gas over the front side of the substrate; and a means for flowing reactant gases over the surface of the front side of the substrate, while inhibiting or prohibiting the flow of reactant gases near the surface of the backside of the substrate.

Some embodiments, relate to providing a wafer gap region between the backside of the substrate and the susceptor plate. In embodiments, the wafer gap region may be ventilated, so as to remove auto-dopants. Some embodiments provide a barrier between the flow of inert gas and the flow of reactant gases. Embodiments relate to reducing the concentration of auto-dopants incorporated into the lightly doped epitaxial semiconductor layer on the front side of the substrate, where the epitaxial layer is being deposited.

Embodiments may provide the means for ventilating the wafer gap region that may comprise flowing substantial amounts of inert gas through the wafer gap region. Flowing substantial amounts of inert gas through the wafer gap region may provide that mixing of inert gas with auto-dopants is the predominant mechanism by which auto-dopants may be removed from the wafer gap region.

Embodiments may provide a method of using an epitaxial apparatus that supports a substrate above a susceptor plate for depositing an epitaxial layer on the substrate, which may comprise providing a spacer and a wafer processing structure onto a susceptor in a processing chamber of an epitaxial reactor apparatus; wherein the wafer processing structure may comprise a wafer support ring and a wafer holder structure attached to the wafer support ring; providing a substrate; wherein the substrate comprises a front side and a backside; wherein the spacer may be in contact with the wafer support ring and positioned on the susceptor plate, wherein the spacer may position the wafer support ring above the susceptor plate to provide a wafer gap region between the susceptor plate and the backside of the substrate; wherein the backside of the substrate may comprises a heavily doped semiconductor; flowing an inert gas into the processing chamber proximate to the wafer gap region and below the backside of the substrate; flowing reactant gases into the processing chamber onto the front side of the substrate; growing a lightly doped epitaxial semiconductor layer on the front side of the substrate from the reactant gases; and exhausting the inert gas containing auto-dopants out from the wafer gap region and below the top of the wafer processing structure out of the processing chamber.

Embodiments may further comprise adjusting the wafer gap region, by means of adjustable spacers. Embodiments may comprise reducing the concentration of auto-dopants in the wafer gap region and providing barriers to keep the flows of reactant gases separate from the flow of inert gas, thus reducing the risk of incorporating auto-dopant contaminants into the lightly doped epitaxial semiconductor layer on the front side of the substrate and reducing the deposition of epitaxial material on the backside of the substrate. Embodiments may further comprise rotating the susceptor plate, the wafer processing structure, and the substrate during the deposition of the epitaxial layer.

BRIEF DESCRIPTION OF THE DRAWINGS

The invention is described by way of example with reference to the accompanying drawings, wherein.

DETAILED DESCRIPTION OF THE INVENTION

In the following description, various aspects of the present invention will be described, and various details set forth in order to provide a thorough understanding of the present invention. However, it would be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1A through 13 are merely illustrative and may not be drawn to scale. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some embodiments anticipate the application of the invention in any high temperature process where contaminants from the backside of a substrate contaminate the front side of the substrate, such as in chemical vapor deposition (CVD) processes and in the formation of silicon-on-insulator (SOI) substrates. However, most embodiments discussed will generally relate to epitaxial deposition apparatus and processes, but are not intended to limit the embodiments to only epitaxial apparatus and processes. In embodiments, the substrate may comprise a heavily doped material. In embodiments, the heavily doped substrate may comprise a heavily doped semiconductor. In embodiments, the substrate may comprise a heavily doped single crystal silicon or single crystal silicon-germanium material. In embodiments, the substrate may comprise a silicon on insulator substrate. In embodiments, the epitaxial layer may comprise lightly doped single crystal silicon or single crystal silicon-germanium material.

Figure 1A:
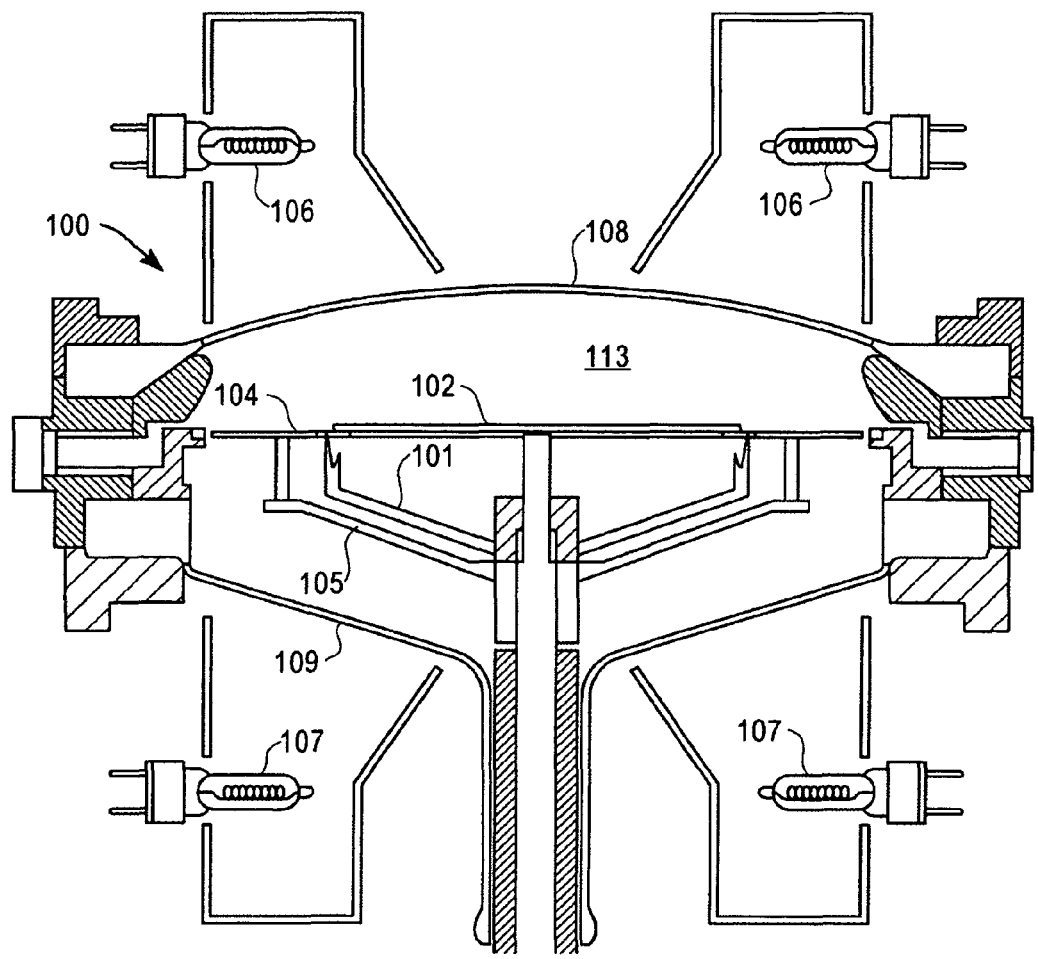
FIG. 1A illustrates a cross-sectional view of a prior art epitaxial processing chamber and apparatus.
Figure 1B:
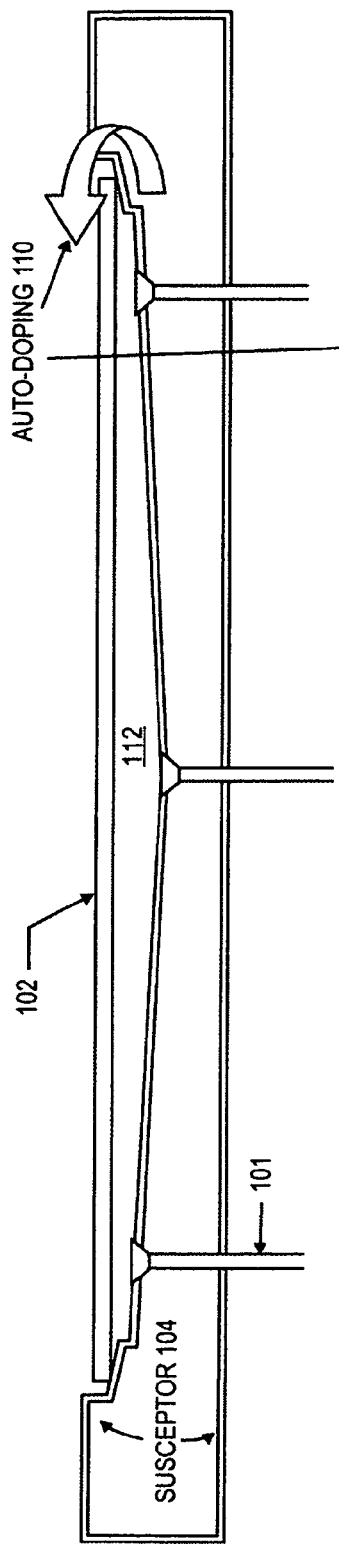
FIG. 1B illustrates a cross-sectional view of a prior art susceptor with a wafer.
Figure 1C:
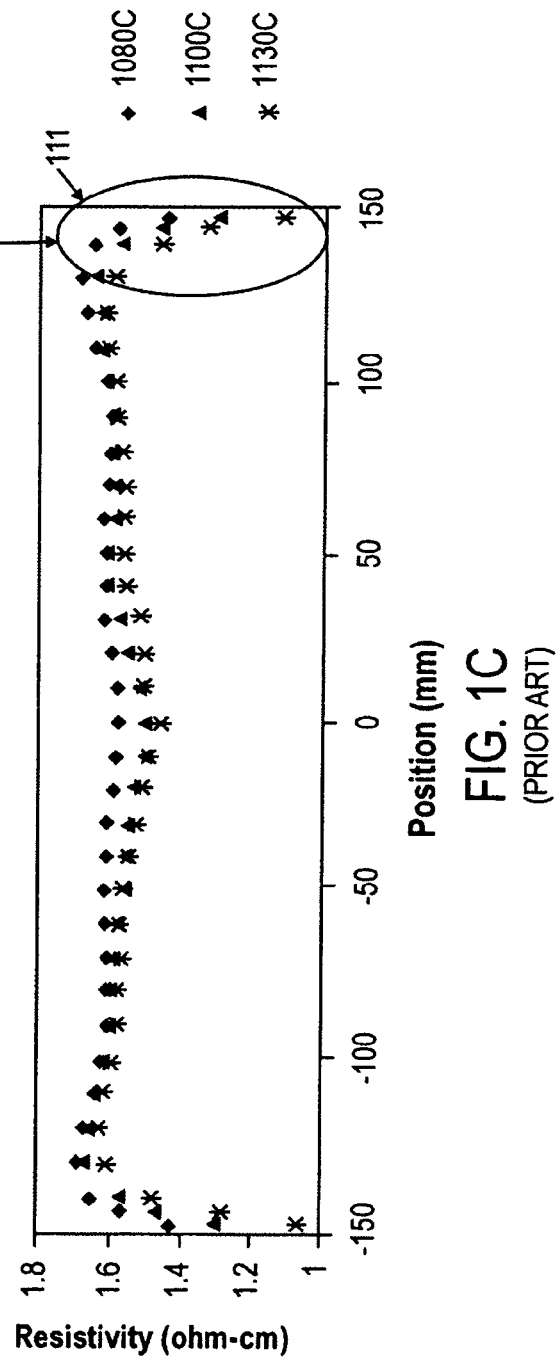
FIG. 1C illustrates a resistivity profile of a prior art deposition of an epitaxial layer exhibiting auto-doping.
Figure 2A:
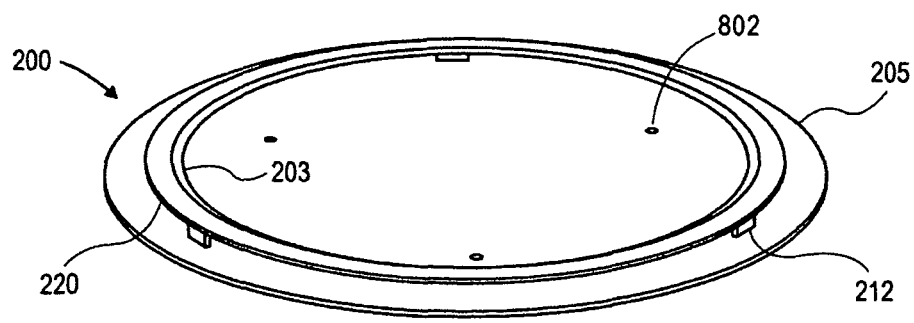
FIG. 2A illustrates a three dimensional view of embodiments comprising a wafer processing structure installed on a susceptor plate.
Figure 2B:
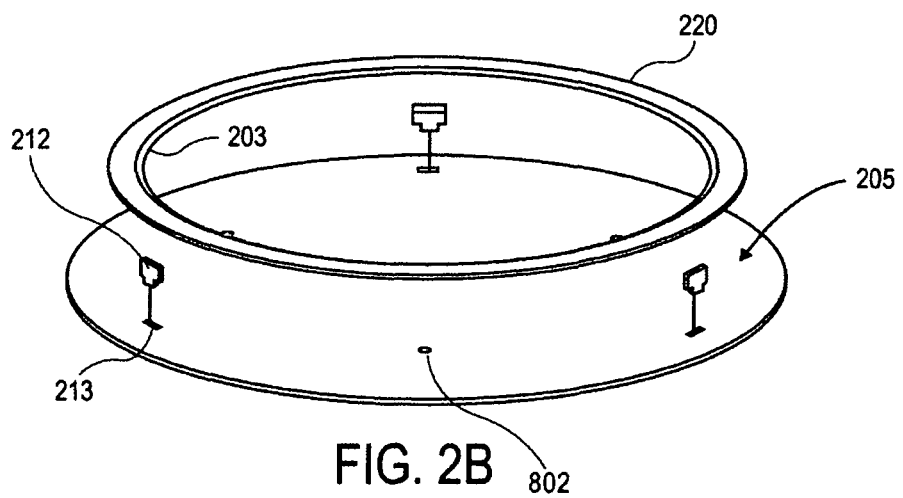
FIG. 2B illustrates an exploded three-dimensional view of embodiments comprising a wafer processing structure on a susceptor plate.
Figure 2C:
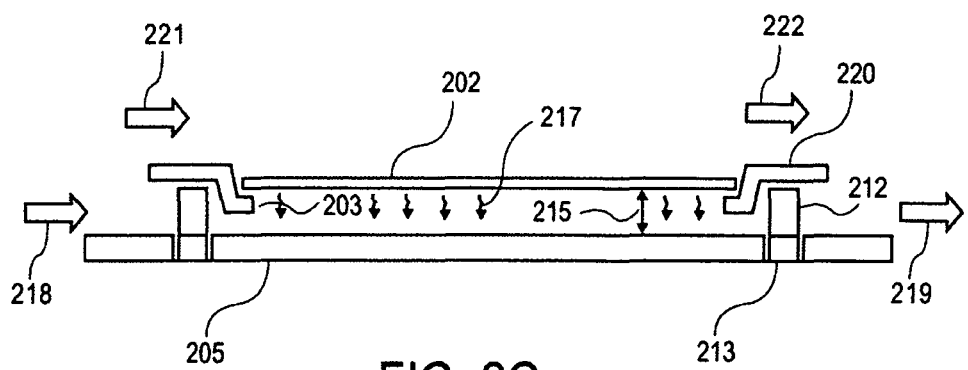
FIG. 2C illustrates a cross-sectional view of embodiments comprising a wafer processing structure holding a wafer on a susceptor plate.
Figure 13:
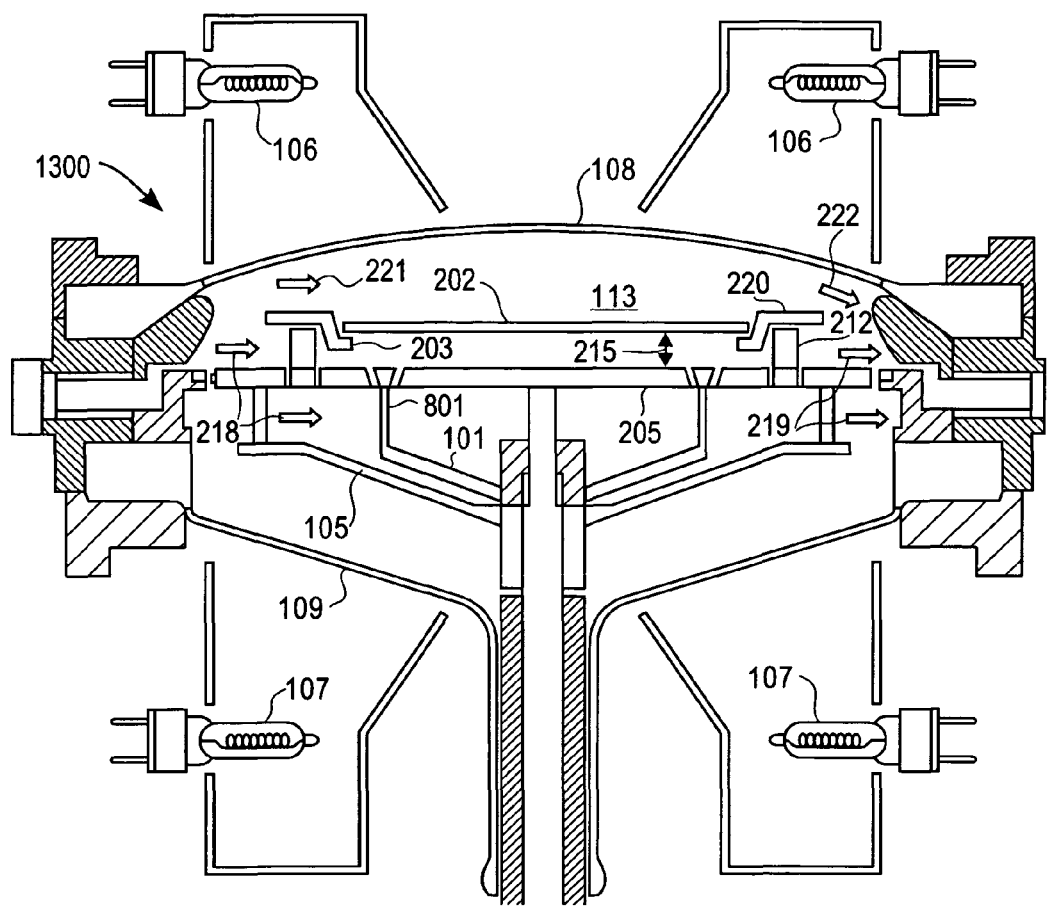
FIG. 13 illustrates an epitaxial processing apparatus with an embodiment of a wafer holder.

Embodiments, illustrated in FIG. 2C, relate to providing a wafer gap region 215 between the backside of the substrate 202 and the susceptor plate 205, which may be used in a reduced auto-doping epitaxial apparatus 1300, illustrated in FIG. 13. In embodiments, the wafer gap region 215 may be ventilated, so as to remove auto-dopants 217. Further, some embodiments provide a barrier between the flow of inert gas 218, 219 and the flow of reactant gases 221, 222. In embodiments, the reactant gases 221 may comprise a silicon precursor gas used to form a single crystal silicon or single crystal silicon-germanium epitaxial layer. Embodiments of a silicon precursor gas may comprise $SiH_4$ or silane gas. In embodiments, the reactant gases 221 may further comprise a germanium precursor used to form a single crystal silicon-germanium epitaxial layer. Embodiments of a germanium precursor gas may comprise $GeH_4$. In embodiments, the reactant gases 221 may further comprise one or more dopant precursors used to dope the single crystal epitaxial layer. Embodiments of a dopant precursor gas may comprise diborane or borane. Reactant gases 221 for forming and doping an epitaxial layer may be well known in the art.

Ventilating the wafer gap region 215 may result in a substantial reduction of the concentration of auto-dopants 217 in the wafer gap region 215. A reduction in the concentration of auto-dopants 217 may reduce the amount of auto-dopants 217 that may migrate to the front side of the substrate 202 and contaminate the epitaxial layer being formed on the substrate 202. In some embodiments, a barrier between the backside and front side of a substrate 202, may also reduce the amount of auto-dopants 217 that may migrate to the front side of the substrate 202 and contaminate the epitaxial layer.

A barrier between the backside and front side of a substrate 202, may help isolate the flow of reactants 221, 222 to the front side of the substrate 202 and away from the backside. Isolating reactants 221, 222 from the backside of the substrate 202 may reduce the deposition of epitaxial material onto the backside of the substrate 202. Epitaxial material deposited on the backside of a substrate 202 may likely need to be removed in subsequent processes so that the substrate 202 can lie flat, which is particularly important in lithographic processes where the imaging plane is important. In addition to the extra costs associated with extra processing steps, such as etching the backside of the substrate 202, there is also an increase in the risk of forming backside defects, such as scratches and haze.

FIG. 2A illustrates a 3-D view of embodiments of a wafer processing structure 200 installed on a susceptor plate 205, which may be used in a reduced auto-doping epitaxial apparatus 1300, illustrated in FIG. 13. The wafer processing structure 200 supports a substrate 202 above a susceptor plate 205. The wafer processing structure 200 comprises a wafer support ring 220 and a wafer holder structure 203 attached to the wafer support ring 220, wherein the wafer holder structure 203 supports the substrate 202 in a position for processing. In some embodiments, the wafer support ring 220 may be positioned by adjustable stand-off pin spacers 212, which are inserted into stand-off pin slots 213 located in the susceptor plate 205. In some embodiments, the positioned wafer support ring 220 may be approximately parallel to the susceptor plate 205. In some embodiments, the wafer processing structure 200 is slightly inclined with respect to the susceptor plate 205, wherein the substrate 202 held by the wafer processing structure 200 is slightly lower on the injection side and slightly higher on the exhaust side. In the embodiments illustrated in FIG. 2C, the wafer holder structure 203 may be a shelf and may be constructed with the wafer support ring 220 as a single unit.

Embodiments of the wafer support ring 220 may comprise one or more materials selected from a group consisting of: silicon carbide, quartz, graphite, silicon nitride, aluminum nitride, or any combination thereof. Embodiments of the wafer holder structure 203 may comprise one or more materials selected from a group consisting of: silicon carbide, quartz, graphite, silicon nitride, aluminum nitride, or any combination thereof. Embodiments of the spacer 212 may comprise one or more materials selected from a group consisting of: silicon carbide, quartz, graphite, silicon nitride, aluminum nitride, or any combination thereof. In some embodiments, any components, or any combination of components, of the wafer processing structure 200 may comprise one or more materials selected from a group consisting of: silicon carbide, quartz, graphite, silicon nitride, aluminum nitride, or any combination thereof.

In some embodiments, any components, or any combination of components, of the wafer processing structure 200 may be constructed of materials that are thick enough to maintain structural integrity for handling and to endure the epitaxial process, but thin enough to provide a low thermal mass for the wafer processing structure 200. A low thermal mass of the wafer processing structure 200 may provide a quick heat up and cool down of the wafer processing structure 200. Rapid heating and cooling of the wafer processing structure 200 may help to facilitate the quick heat up and cool down of the substrates 202 being processed. Throughput of the epitaxial apparatus may increase with a low thermal mass wafer processing structure 200. In embodiments, the thickness of the walls of the wafer support ring 220 may be between about 0.002 inches to about 0.3 inches. In an embodiment, the thickness of the walls of the wafer support ring 220 may be about 0.005 inches to about 0.015 inches.

Embodiments in FIG. 2C, illustrate that the topside of the susceptor plate 205, which faces the backside of the substrate 202, may be approximately flat. A susceptor plate 205 with a flat topside may result in improved temperature uniformity across the substrate 202. The growth rate of an epitaxial layer depends on the temperature of the substrate during processing. Therefore, improved temperature uniformity may likely result in improved thickness uniformity across the substrate 202.

FIG. 2B illustrates an exploded view of embodiments wherein the wafer support ring 220 and the spacer 212 are detachable from the susceptor plate 205. Some embodiments provide spacers 212, which are adjustable, thereby adjusting the thickness of the wafer gap region 215. In embodiments illustrated in FIGS. 2B and 2C, the spacer comprises a stand-off pin 212. In an embodiment illustrated in FIG. 4, the stand-off pin 212 comprises a pin protrusion 417, which fits into a stand-off pin slot 213 in the susceptor plate 205. In an embodiment, pin lips 418 rest on the susceptor plate 205, which may provide a means to precisely and consistently fix the spacer height above the susceptor plate 205. In an embodiment, pin screws 216 may be used to attach the stand-off pin spacers 212 to the wafer support ring 220. FIG. 3B illustrates an embodiment wherein the stand-off pin spacers 212 are attached by pin screws 216 to a support ring skirt 301. In an embodiment, the stand-off pin spacers 212 are detachable from the wafer support ring 220 and can be replaced with different sized stand-off pin spacers 212. Therefore, the thickness of the wafer gap region 215 may be adjusted by using different spacers 212. In embodiments, the wafer gap region 215 has a thickness of about 0.1 inches to about 0.3 inches. In an embodiment, the wafer gap region 215 has a thickness of about 0.15 inches to about 0.25 inches.

FIG. 2C illustrates embodiments wherein auto-dopants 217 may diffuse out from the backside of substrate 202 and into the wafer gap region 215. The wafer gap region 215 may be ventilated by injected inert gas 218, wherein the auto-dopants 217 mix with the injected inert gas 218, which then becomes an exhaust inert gas 219, which may then exhausted from the processing chamber. Various embodiments provide that an inert gas 218 may flow through the wafer gap region 215 so as to ventilate auto-dopants 217 from the wafer gap region 215, wherein auto-dopants 217 comprise dopants that diffuse out of the backside of the substrate 202 during a high temperature process. In an embodiment, the high temperature process comprises an epitaxial deposition.

Embodiments illustrated in FIG. 2C provide for injected reactant gases 221 to flow over the front side of the substrate 202, and exhaust reacted gases 222 to flow away from the substrate 202. In embodiments, the substrate 202 may be supported at the edges, which may provide a barrier to the flow of reactant gases 221 onto the backside of the substrate 202, thus helping to reduce the deposition of epitaxial material onto the backside of the substrate 202.

Figure 9A:
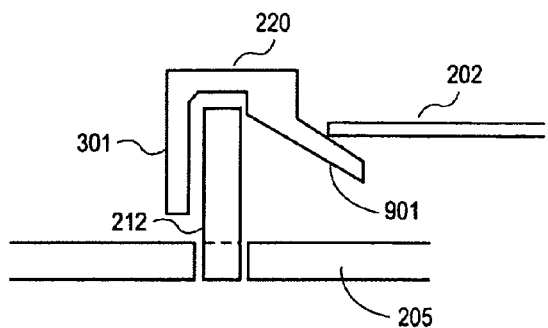
FIGS. 9A to 9E illustrate cross-sectional views of various embodiments of a wafer holder structure.
Figure 9B:
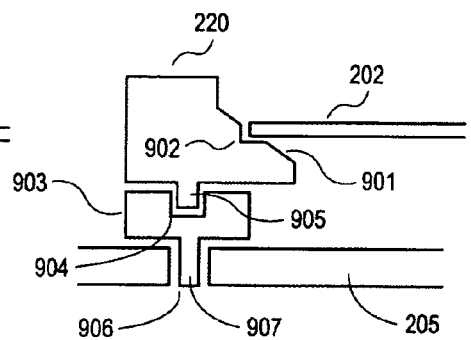
Figure 9C:
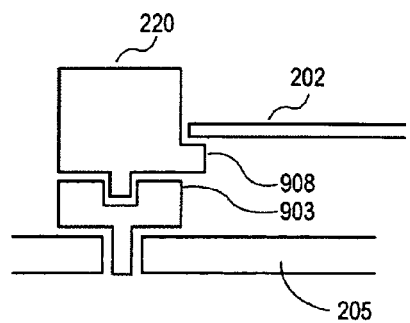
Figure 9D:
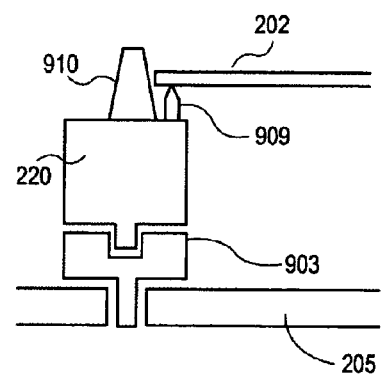

FIGS. 9A to 9F illustrate embodiments of the wafer holder structure 203 consisting of: a shelf, a bevel, a lip, a protrusion, a finger, or any combination thereof. FIG. 9A illustrates embodiments wherein the wafer holder structure 203 comprises a wafer holder bevel 901, which may be attached to the wafer support ring 220. FIG. 9B illustrates embodiments wherein the wafer holder bevel 901 comprises a notch 902, which seats the edge of the substrate 202. FIG. 9C illustrates embodiments wherein the wafer holder structure 203 comprises a wafer holder shelf 908, which may be attached to the wafer support ring 220. FIG. 9D illustrates embodiments wherein the wafer holder structure 203 comprises a wafer holder protrusion 909, which may be attached to the wafer support ring 220. In embodiments, an alignment ring 910 may be attached to the wafer support ring 220 and positioned so as to align the substrate 202 onto the wafer holder protrusion 909. The alignment ring 910 may also act as a barrier to auto-dopants 217 flowing around the edge of the substrate 202 from the backside to the front side.

Figure 9E:
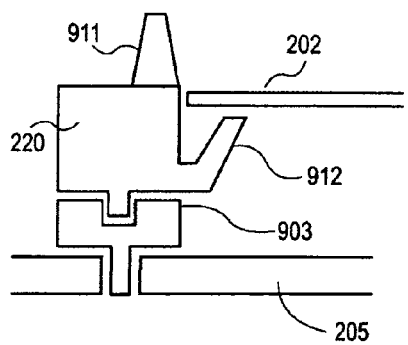
Figure 9F:
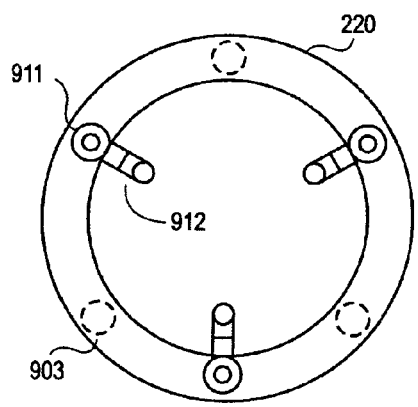
FIG. 9F illustrates a top view of embodiments of a wafer holder structure.

FIGS. 9E and 9F illustrate embodiments wherein the wafer holder structure 203 comprises a wafer holder finger 912, which may be attached to the wafer support ring 220. Wafer holder finger 912 may contact the substrate 202 in three or more locations. In an embodiment, the thermal mass of the wafer holder finger 912 and the thermal mass of the contact point on the substrate 202 match, so as not to cause a cold or hot spot on the substrate 202.

In embodiments, an alignment pin 911 may be located at the inside edge of the wafer support ring 220, so that substrates 202 being loaded are further guided into position. An alignment pin 911 may be used when the substrate 202 is located at or below the top plane of the wafer support ring 220, so that the inside wall of the wafer support ring 220 may have the advantage of serving as a barrier to the flow of auto-dopants 217 to the front side of the substrate 202. In embodiments, an alignment ring 910 may be used when the substrate 202 is positioned above the top of the wafer support ring 220, which may provide the advantage of helping to form a barrier against the flow of gases and materials around the edge of the substrate 202.

Embodiments of the wafer holder structure 203 may comprise the feature that the wafer holder structure 203 and the substrate 202 form a barrier against the passage of gases and materials between the backside of the substrate 202 and the front side of the substrate 202, along the entire perimeter of the substrate 202. In some embodiments illustrated in FIGS. 2C, and 9A to 9D, the wafer holder structure 203 supports the substrate 202 at the edges of the substrate 202. Supporting the substrate 202 at the edges may provide the advantage of helping to provide a barrier to auto-dopants 217 flowing onto the front side of the substrate 202.

An advantage of isolating the flow of inert gas to the backside of the substrate 202 and away from the front side, may result in reducing the risk of auto-doping. In embodiments, the out-diffusion of dopants from the backside of the substrate 202 mixes with the inert gas, which is then exhausted from the processing chamber. In embodiments, the inert gas comprises auto-dopants 217 that may be isolated from the front side of the substrate 202, where the low doped epitaxial layer is being formed. This may substantially reduce the risk of contaminating the low doped epitaxial layer with auto-dopants 217, which may result in substantial increases in the resistivity of the epitaxial layers being formed, while still maintaining good resistivity and thickness uniformity across the substrate 202.

In embodiments, the inert gas comprises a gas selected from the group consisting of: hydrogen, nitrogen, helium, neon, argon, krypton, xenon, radon, or any combination thereof. The inert gas may have the property of not chemically interacting with the reactant gases, or the substrate, or the components of the processing apparatus.

FIG. 2A illustrates embodiments in which a spacer 212 may be in contact with the wafer support ring 220 and positioned on a susceptor plate 205, wherein the spacer 212 positions the wafer support ring 220 above the susceptor plate 205 to provide a wafer gap region 215 between the susceptor plate 205 and the backside of the substrate 202.

Embodiments illustrated in FIGS. 9B to 9F comprise interlocking spacer disks 903. In an embodiment, the interlocking spacer disks 903 further comprise a spacer disk protrusion 907, which may fit into either the spacer disk recess 904 of another interlocking spacer disk 903, or the susceptor positioning hole 906. As illustrated in embodiments in FIG. 9F, the area occupied by spacer disk 903 under the wafer support ring 220 is only a small fraction of the area of the wafer support ring 220, thus providing ample ventilation of the wafer gap region 215 by the flow of injected inert gas 218, see FIG. 2C. In embodiments, the interlocking spacer disks 903 can be stacked, and thereby may be used to adjust the thickness of the wafer gap region 215.

Figure 10A:
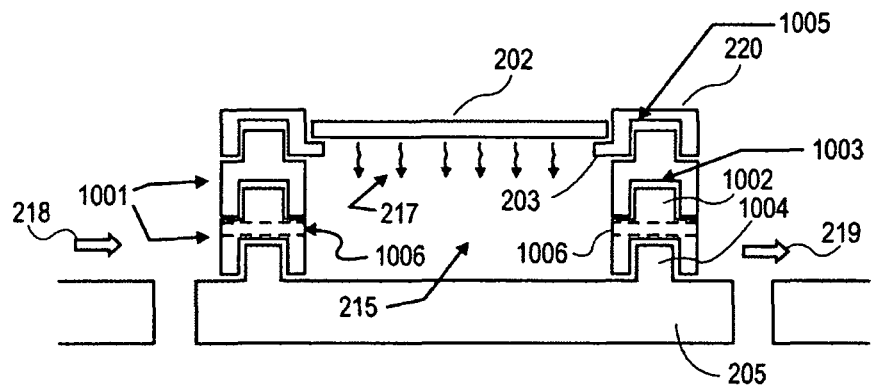
FIGS. 10A and 10B illustrate cross-sectional and top views of embodiments of spacer rings having vents.
Figure 10B:
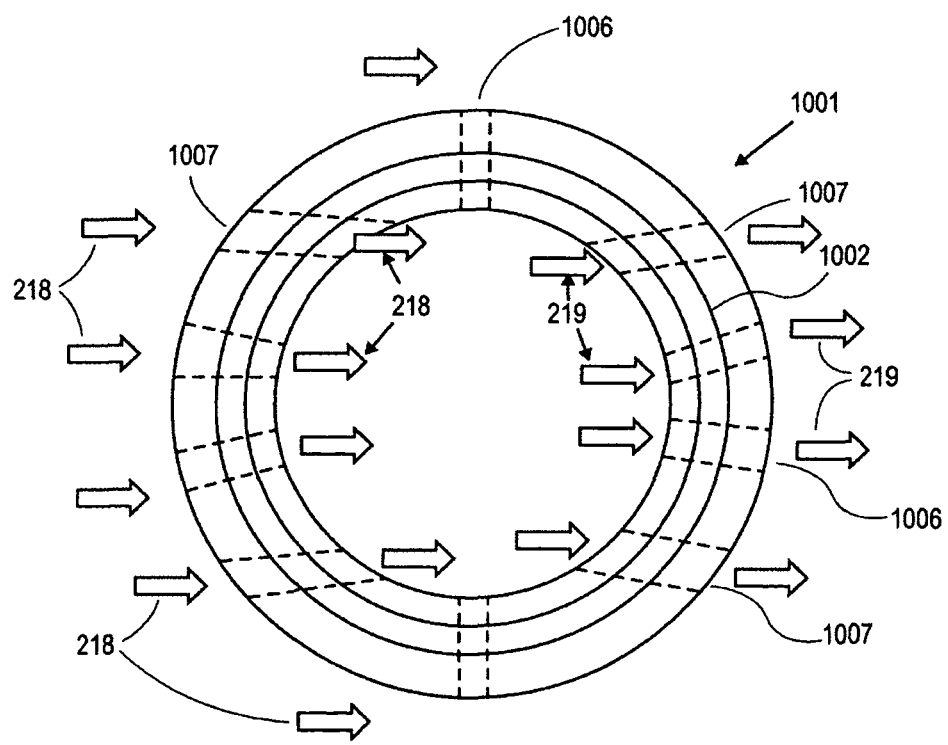
Figure 10C:
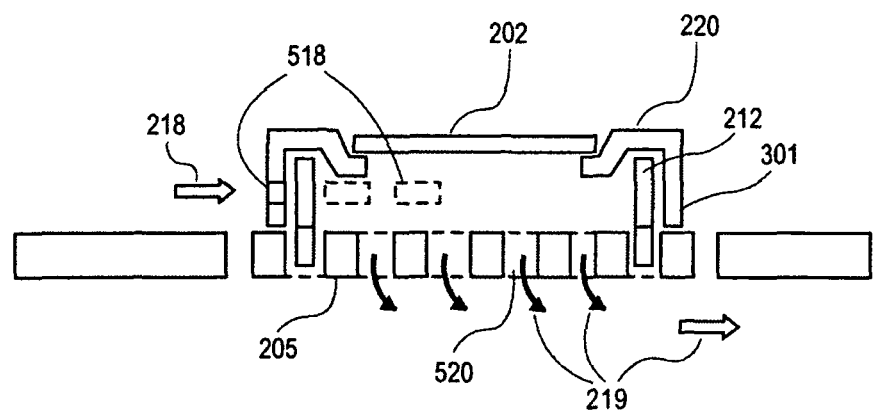
FIG. 10C illustrates a cross-sectional view of embodiments of a skirt having an asymmetrical distribution of vents.

FIG. 10A and 10B illustrate embodiments comprising the feature of spacer rings 1001. Embodiments may comprise one or more spacer rings 1001, which may be stackable, and may comprise vents 1006, which may permit the flow of an injected inert gas 218 through the vents 1006 into and/or out of the wafer gap region 215, so as to ventilate the wafer gap region 215, thus removing auto-dopants 217. In embodiments, the stackable spacer rings 1001 may interlock with each other. In embodiments, the stackable spacer rings 1001 may interlock with the susceptor plate 205, in which the susceptor plate 205 may comprise a susceptor protrusion ring 1004. In embodiments, the stackable spacer rings 1001 may interlock with the wafer support ring 220, in which the wafer support ring 220 may comprise a wafer support ring recess 1005.

Embodiment, partially illustrated in FIG. 10B, may comprise radial vents 1006, which are directed toward the center of the substrate 202. In embodiments, the substrate 202 may be rotated, and the spacer ring vents 1006, 1007 may comprise a symmetrical pattern, which may improve uniformity. Other embodiments, illustrated in FIG. 10B, may comprise non-radial vents 1007, which are directed toward regions other than the center of the substrate 202. Embodiment may comprise any combination of radial and non-radial vents 1006 and 1007, which may be suitable for either or both rotated and stationary substrates 202. In an embodiment illustrated in FIG. 10B, the non-radial vents 1007 may be directed so that the injected inert gas 218 may flow substantially parallel across the wafer gap region 215, when the substrate 202 is not being rotated and in a particular orientation. In embodiments, the non-radial vents 1007 may be directed so that the injected inert gas 218 may flow substantially parallel across the wafer gap region 215 when the substrate 202 is oriented in more than two rotational positions. Such embodiments may provide a pass-through flow more than twice in a single rotation of the substrate 202. Embodiments may comprise that the exhaust inert gases 219 may flow substantially parallel away from the wafer gap region 215.

Embodiments may comprise any combination of radial and non-radial vents 1006,1007, which may be used to generate turbulent flow patterns of injected inert gas 218, which may comprise the formation of one or more vortexes in the wafer gap region 215. Embodiments may further comprise rotating the wafer gap region 215, while generating turbulent flow patterns. Advantages of turbulent flow patterns of injected inert gas 218 in the wafer gap region 215 may be to facilitate the mixing and removal of auto-dopants 217, particularly on and near the surfaces of structures internal to the wafer gap region 215, such as the backside of the substrate 202. Turbulent flow patterns may have the advantage of disrupting the boundary layer on the surfaces of objects in contact with the flow path of the inert gas 218, and thus increases the removal of auto-dopants 217 either on or emanating from those surfaces. An advantage of increasing the removal of auto-dopants 217 from the wafer gap region 215 may be to lower the average concentration of auto-dopants 217 in the wafer gap region 215. A lower concentration of auto-dopants 217 in the wafer gap region 215 may reduce the amount of auto-dopants 217 that may potentially reach the front side of the substrate 202, thus reducing the risk of auto-doping the epitaxial layer formed on the front side of the substrate 202.

Figure 3A:
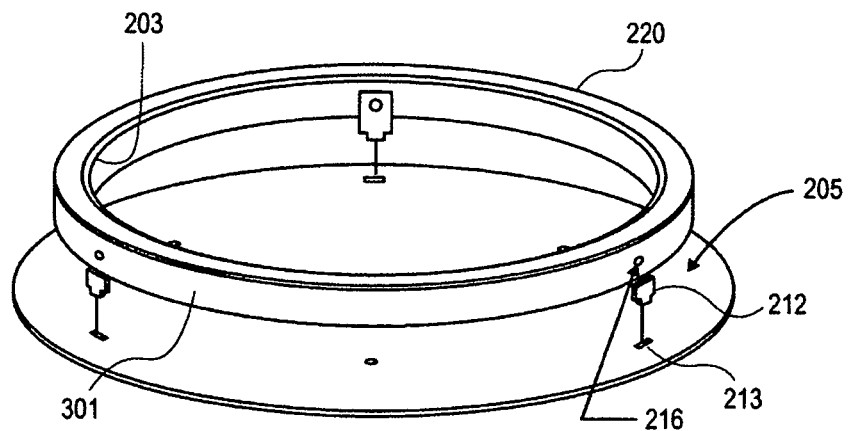
FIG. 3A illustrates an exploded 3-D view of embodiments comprising a wafer processing structure with a skirt on a susceptor plate.
Figure 3B:
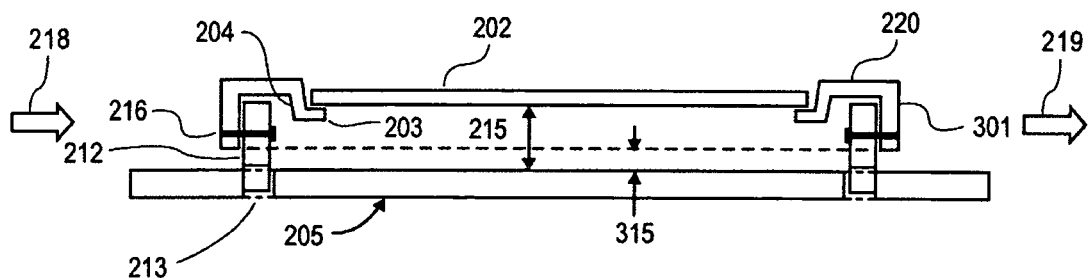
FIG. 3B illustrates a cross-sectional view of embodiments comprising a wafer processing structure with a skirt holding a wafer on a susceptor plate.
Figure 4:
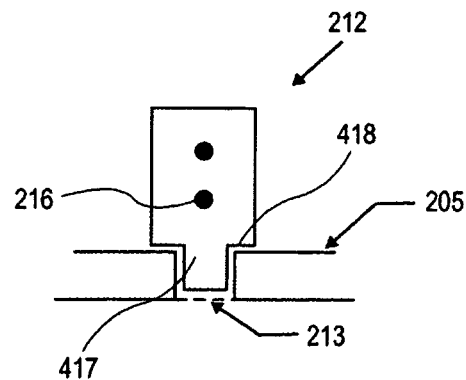
FIG. 4 illustrates a cross-sectional view of embodiments comprising an adjustable standoff pin positioned in a susceptor plate.

FIGS. 3A and 3B illustrate embodiments of an apparatus for supporting a substrate 202 above a susceptor plate 205 further comprising a support ring skirt 301 attached to the wafer support ring 220, and which extends down toward the susceptor plate 205, wherein the flow of an inert gas 218, 219 into and/or out of the wafer gap region 215 is partially restricted, and thus, controlled by the skirt 301. In embodiments, the skirt 301 may comprise a ring having a vertical wall along the circumference of the wafer support ring 220. In embodiments, the size of the skirt gap 315 may be adjusted by the length of the skirt 301 and/or by the adjustable spacer 212. In embodiments wherein the substrate 202 is rotated, a longer skirt 301 may provide for a greater auto-doping pathway 519, but may also reduce the amount of injected inert gas 218 that may enter into the wafer gap region 215. The size of the skirt gap 315 may be used to adjust the flow of inert gas 218, 219, and degree of ventilation, through the wafer gap region 215, see FIG. 6.

Figure 10D:
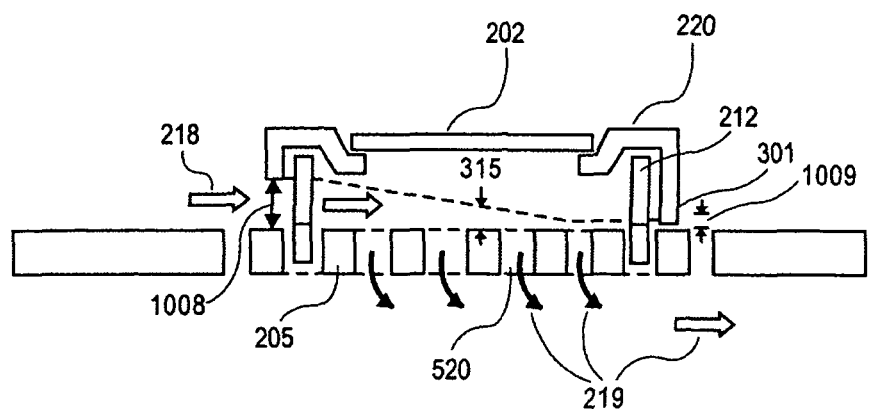
FIG. 10D illustrates a cross-sectional view of embodiments of a skirt having an asymmetrical length.

Embodiments illustrated in FIG. 10D wherein the size of the skirt gap 315 may be asymmetrical and the substrate 202 may not be rotated. In embodiments, the skirt gap 315 or intake skirt clearance 1008, on the upwind or injection side of the inert gas flow 218 may be large, while the skirt gap 315 or exhaust skirt clearance 1009, on the downwind or exhaust side of the inert gas flow 219 may be small. Such an asymmetrical skirt gap 315 may permit ample flow of inert gas 218 into the wafer gap region 215, while limiting the exhaust inert gas 219, which contains auto-dopants 217, to exhaust close to the susceptor plate 205 and far from the front side of the substrate 202, thus reducing the risk of auto-dopants migrating to the front side of the substrate 202. In an embodiment, a susceptor plate 205 having vents 520 may provide a substantive means of exhausting inert gas 219 from the wafer gap region 215.

Figure 5A:
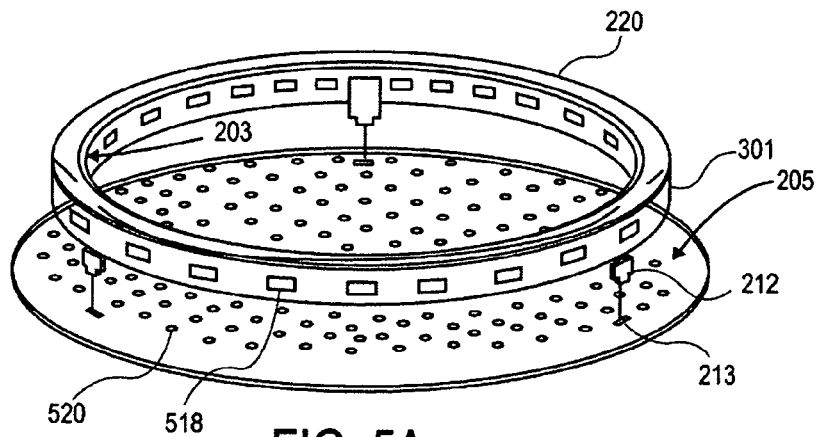
FIG. 5A illustrates a 3-D view of embodiments comprising a wafer processing structure with a skirt having vents on a susceptor plate also having vents.
Figure 5B:
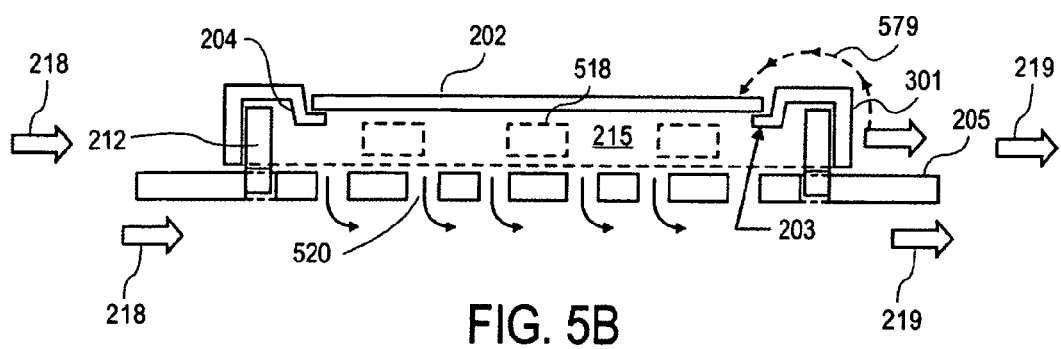
FIG. 5B illustrates a cross-sectional view of embodiments comprising a wafer processing structure with a skirt having vents holding a wafer on a susceptor plate also with vents.

FIGS. 5A and 5B illustrate embodiments comprising a skirt 301, which may further comprise skirt vents 518, which may permit the flow of inert gas 218, 219 through the skirt vents 518 into and/or out of the wafer gap region 215. In an embodiment illustrated in FIG. 10C, the distribution of skirt vents 518 may be asymmetrical. In an embodiment, in which the substrate 202 may not be rotated, the number and size of skirt vents 518 may be high at the injection side of the injection inert gas flow 218 and low at the exhaust side of the exhaust inert gas flow 219, so as to direct the inert exhaust gases 219 through the susceptor vents 520 and exhausted from below the susceptor plate 205 far from the front side of the substrate 202.

Various embodiments are anticipated for rotated and/or stationary substrates 202 during processing, which combine various different sizes of skirt gap 315, both symmetrical and asymmetrical, with various different sizes and numbers of skirt vents 518, both symmetrically and asymmetrically distributed, which may result in effective ventilation of auto-dopants 217 from the wafer gap region 215 and remove the inert exhaust gases 219 distal to the front side of the substrate 202.

In embodiments illustrated in FIGS. 5A and 5B, the susceptor plate 205 comprises susceptor vents 520. In various embodiments, injected inert gas 218 may flow into the wafer gap region 215 mixing with the auto-dopants diffusing out from the backside of the substrate 202. The resultant exhaust inert gas 219 may be removed from the wafer gap region 215 by either susceptor vents 520, skirt vents 518, skirt gap 315, or any combination thereof, see also FIG. 6. In embodiments, the injected inert gas 218 may also flow below the susceptor plate 205, mix with the exhaust inert gases 219 flowing out of the wafer gap region 215 through the susceptor vents 520, and exhaust out from below the susceptor plate 205. An advantage to providing injected inert gas 218 below the susceptor plate 205 and removing the exhaust inert gases also below the susceptor plate 205 may be that the flow of auto-dopants 217 may be more distant from the front side of the substrate 202, which may further reduce the risk of auto-doping the deposited epitaxial layer. In some embodiment, the combination of symmetrical and asymmetrically distributed skirt vents 518 and/or symmetrical and asymmetrical skirt lengths 301 with susceptor vents 520 may be configured to substantially restrict the flow of exhaust inert gases 219 from exhausting above the susceptor plate 205. This may result in most or almost all of the exhaust inert gas 219 exhausting below the susceptor plate 205, so that the susceptor plate 215 may act as a barrier to auto-dopants 217 from the front side of the substrate 202.

In embodiments, the susceptor vents 520 may range from about ⅛ to about ¼ of an inch. In embodiments, the susceptor plate 205 may comprise a material selected from a group consisting of: silicon carbide, graphite, aluminum nitride, other ceramics, or any combination thereof. In embodiments, the susceptor plate 205 may comprises a porous material structure. In embodiments, the susceptor plate 205 may comprises a ventilated structure, and thus provide ample flow out from the wafer gap region 215, through the susceptor plate 205, and under the susceptor plate 205. A porous or ventilated susceptor plate 205 may provide a low thermal mass, which may result in faster heating and cooling of the susceptor plate 205, and thus, may facilitate faster heating and cooling of the substrate 202, which may result in higher wafer throughput.

Figure 6:
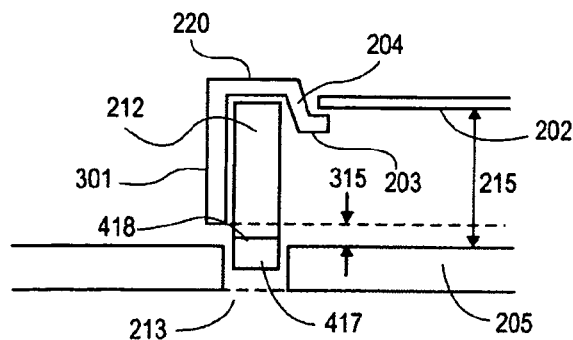
FIG. 6 illustrates an enlarged cross-sectional view of embodiments comprising part of a wafer processing structure with a skirt and a spacer holding a wafer on a susceptor plate.
Figure 7:
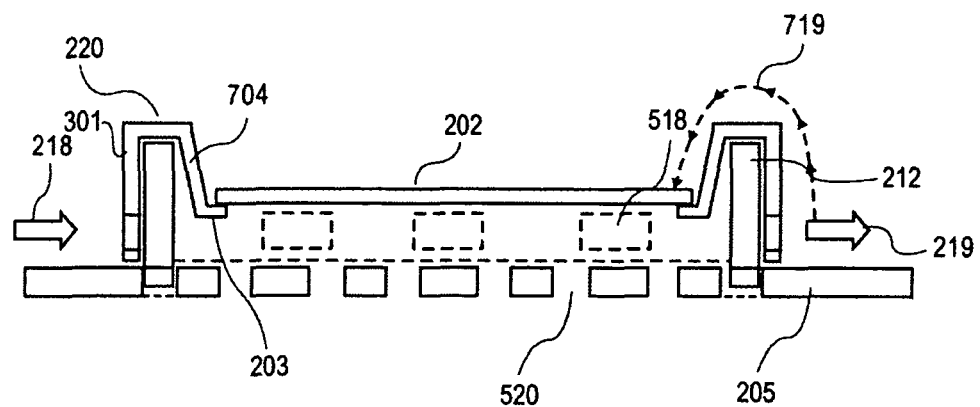
FIG. 7 illustrates a cross-sectional view of embodiments comprising a wafer processing structure with a shelf extension and a skirt having vents holding a wafer on a susceptor plate with vents.
Figure 8:
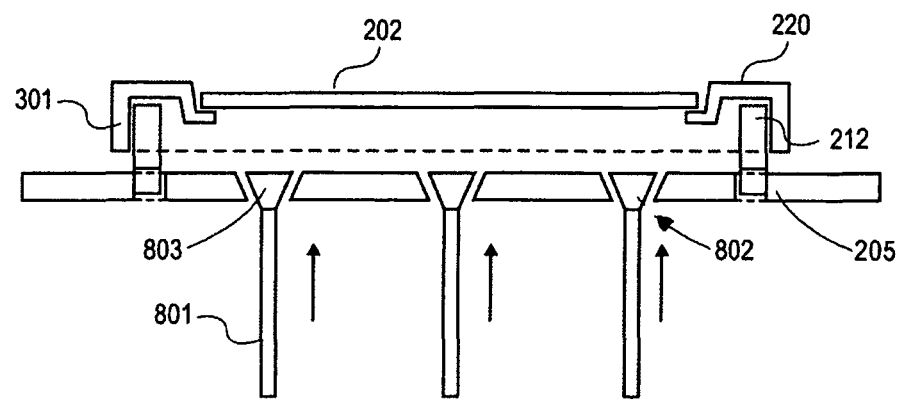
FIG. 8 illustrates a cross-sectional view of embodiments comprising a wafer processing structure with a skirt holding a wafer on a susceptor plate with lift fingers used to load and unload wafers.

FIGS. 6 and 7 illustrate embodiments that may comprise a support ring skirt 301 attached to the wafer support ring 220 and extends down toward the susceptor plate 205, wherein the flow of inert gas 218, 219 into and/or out of the wafer gap region 215 may be partially restricted, and thus, controlled by the skirt 301. Further embodiments of the wafer processing structure 200 illustrated in FIGS. 6 and 7 may further comprise a shelf extension 204, 704 positioned between and attached to the wafer support ring 220 and the wafer holder structure 203. FIG. 6 illustrates embodiments, which may comprise a small shelf extension 204, whereas the embodiments illustrated in FIG. 7, may comprises a large shelf extension 704.

Embodiments illustrated in FIG. 5B may comprise a small shelf extension 204, which may position the front side of the substrate 202 proximate to the plane of the top of the wafer support ring 220. Auto-dopants 217 may migrate approximately along an unextended auto-doping pathway 519. Embodiments illustrated in FIG. 7 may comprise a large shelf extension 704, which may position the front side of the substrate 202 substantially distant from the plane of the top of the wafer support ring 220. The substrate 202 may be positioned in a valley surrounded by the wafer processing structure 200, which overlooks the substrate 202. Auto-dopants 217 may migrate approximately along an extended auto-doping pathway 719, which is longer and more likely to result in a greater reduction of auto-doping of the epitaxial layer on the front side of the substrate 202.

Figure 10E:
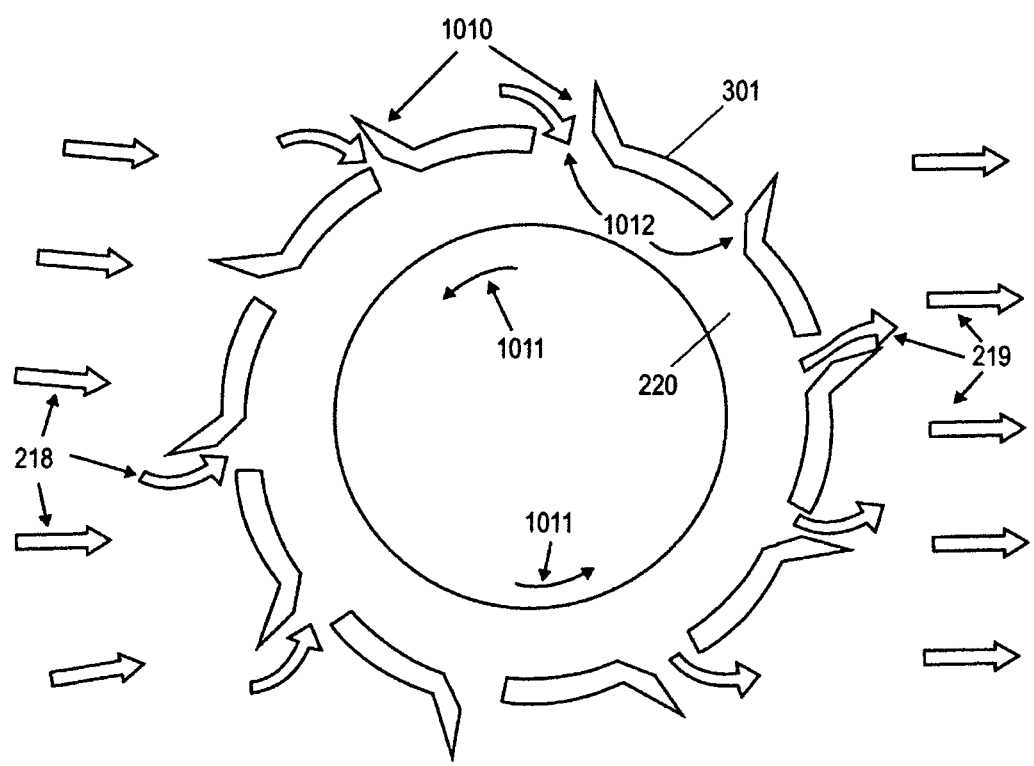
FIG. 10E illustrates a top view of embodiments of a skirt having turbine blades and vents.

FIG. 10E illustrate embodiments wherein the support ring skirt 301 further comprises skirt vents 518, which may further comprise turbine skirt blades 1010, wherein the turbine skirt blades 1010 during rotation of the wafer support ring 220 and support ring skirt 301, facilitate the intake and/or exhaust of inert gases 218, 219 into and/or out of the wafer gap region 215. In embodiments, the turbine skirt blades 1010 may be attached to the support ring skirt 301 proximate to the trailing side of the skirt vents 518, wherein the trailing side of the skirt vent 518 may be described as the last side to reach a fixed point when the skirt is being rotated in a particular rotation direction 1011. In embodiments, the turbine skirt blades 1010 may be formed from the support ring skirt 301 while also forming the turbine skirt vents 1012. In embodiments, the turbine skirt vent 1012 may be formed by cutting the skirt 301 on three of the four sides of the vent 1012. In embodiments, the skirt material may still be attached to the edge of the vent 1012 and may be bent outward, so as to protrude from the outside of the wafer support ring 220 and skirt 301. The protruding skirt material, still attached to the skirt 301 may be used as the turbine skirt blades 1010.

In embodiments, wherein the turbine skirt blade 1010 may be directed out from the point of attachment to the skirt 301 in the direction of rotation 1011, then the turbine blades 1010 may increase the pressure of inert gas in the wafer gap region 215 proportional to the rotational speed of the turbine blades 1010. In embodiments wherein the turbine blades 1010 may be directed opposite the direction of rotation 1011, then the turbine blades 1010 may decrease the pressure of inert gas in the wafer gap region 215 proportional to the rotational speed of the turbine blades 1010. Some embodiments may include various combinations of skirt vents 518 and turbine blades 1010, which may be directed in either the same or opposite the direction of rotation 1011. Embodiment may comprise two rings of structures in the support ring skirt 301, wherein the top ring of structures may comprise skirt vents 301 and/or turbine skirt vents 1012 having turbine blades 1010 co-directional with the direction of rotation 1011, and wherein the bottom ring of structures may comprise turbine skirt vents 1012 having turbine blades 1010 opposite the direction of rotation 1011. Such a configuration may facilitate the intake of inert gas 218 at the top ring of structures and exhaust inert gas 219 at the bottom ring of structures, whereby a flow pattern may be generated that provides a flow of inert gas 218 near the backside of the substrate 202 and exhausts the mixture of inert gas 219 and auto-dopants 217 out near the susceptor plate 205, thus increasing the auto-doping pathway 519.

Figure 11:
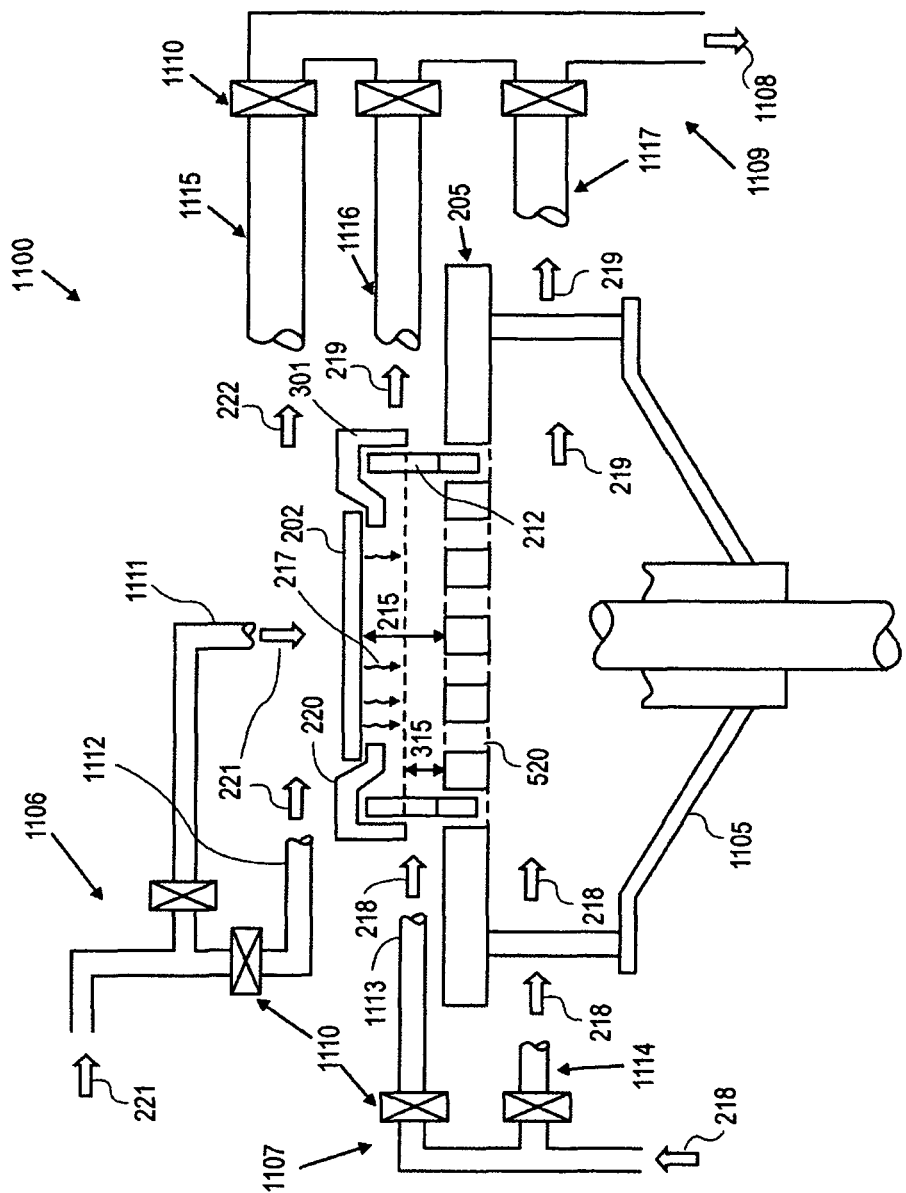
FIG. 11 illustrates a cross-sectional view of embodiments of a wafer processing structure within an epitaxial deposition apparatus.

FIGS. 11 and 13 illustrate embodiments of an apparatus 1100, 1300 for depositing an epitaxial layer on a substrate 202, which may comprise a processing chamber 113; a susceptor plate 205 within the processing chamber 113; a wafer processing structure 200 for supporting a substrate 202 over the susceptor plate 205; wherein the substrate 202 comprises a front side and a backside; wherein the front side faces up and the backside of the substrate 202 faces down towards the susceptor plate 205; wherein the wafer processing structure 200 may comprise a wafer support ring 220 and a wafer holder structure 203 attached to the wafer support ring 220. In embodiments, the apparatus 1100, 1300 may further comprise a spacer 212 in contact with the wafer support ring 220 and positioned on the susceptor plate 205, wherein the spacer 212 positions the wafer support ring 220 above the susceptor plate 205 to provide a wafer gap region 215 between the susceptor plate 205 and the backside of the substrate 202.

In embodiments, the apparatus 1100, 1300 may further comprise an upper injection manifold 1106 for providing reactant gases 221 into the processing chamber 100 and onto the front side of the substrate 202; a lower injection manifold 1107 for providing an inert gas 218 into the processing chamber 113 proximate to the wafer gap region 215; and a lower exhaust manifold 1109 for removing exhaust gases 1108 containing auto-dopants 217 from the processing chamber 113. In embodiments, the exhaust gases 1108 may comprise inert gas 219 containing auto-dopants 217 from the backside of the substrate 202. Embodiments may further comprising a reacted gases exhaust port 1115 for removing reacted and residual reactant gases 222 from the region over the front side of the substrate 202, whereby reactant gases may be distanced from the backside of the substrate 202. In embodiments, the reacted gases exhaust port 1115 further comprises a flow control valve 1110, which may be used to control the flow of exhaust reacted gases 222.

Embodiments may further comprise upper and lower injection manifolds 1106, 1107 and upper and lower exhaust ports 1115, 1116, 1117 to provide a means for separating and isolating the flow of reactant gases 222 on the front side of the substrate 202 away from the flow of inert gas 218 on the backside of the substrate 202. Separating and isolating reactant gases 222 from the backside of the substrate 202 may reduce the risk of depositing epitaxial material on the backside of the substrate 202. Epitaxial deposits on the backside of the substrate 202 may likely require that the deposits be removed later, which may increase the risk of backside defects, such as scratches and haze.

Embodiments illustrated in FIG. 11 may comprise one or more reactant injection ports 1111, 1112 in communication with the upper injection manifold 1106. Embodiments may comprise an edge reactant gases injection port 1112 providing reactant gases 221, which may flow across the substrate 202, which in embodiments may be rotated during processing. Embodiments may further comprise a flow control valve 1110 to control the flow of reactant gases 221 from the edge reactant gases injection port 1112. Embodiments may further comprise a center reactant gases injection port 1111, which may be located proximate to the center of the substrate 202. Embodiments may further comprise a flow control valve 1110 to control the flow of reactant gases 221 from the center reactant gases injection port 1111. A center reactant gases injection port 1111, located proximate to the center of a rotating substrate 202, may provide improved thickness uniformity since the edge injection port 1112 would likely provide fresh reactants to the edges of the substrate 202. However, without a direct flow of reactants to the center, the center may likely be provided with only partially used reactants. Therefore, the center port 1111 may provide fresh reactants to the center, which may increase the growth of epitaxial material in the center of the substrate 202, which may facilitate thickness uniformity of the epitaxial layer being formed on the front side of the substrate 202. In embodiments, the upper injection manifold 1106 may further comprise a plurality of outlets and/or ports over the front side of the substrate 202. In embodiments, the upper injection manifold 1106 may further comprise a showerhead of inlets and/or outlets over the front side of the substrate 202.

Embodiments illustrated in FIG. 11 may comprise one or more inert gas injection ports 1113, 1114 in communication with the lower injection manifold 1107. Embodiments may comprise an upper inert gas injection port 1113, located above the susceptor plate 205, providing inert gas 218, which may flow into the wafer gap region 215, which in embodiments may be rotated. Embodiments may further comprise a flow control valve 1110 to control the flow of inert gas 218 from the upper inert gas injection port 1113. Embodiments may further comprise a lower inert gas injection port 1114, which may be located below the susceptor plate 205. Embodiments may further comprise a flow control valve 1110 to control the flow of inert gas 218 from the lower inert gas injection port 1114. In embodiments, the susceptor plate 205 may comprising susceptor vents 520, which may provide additional ventilation of the wafer gap region 215. In embodiments, the susceptor vents 520 may range from about ⅛ to about ¼ of an inch.

FIG. 11 illustrates embodiments that may comprise one or more exhaust ports 1115, 1116, 1117 in communication with an exhaust manifold 1109, which may be used to facilitate the control of flow patterns of inert gas 218 and reactant gases 221. Embodiments may further comprise that any or all of the exhaust ports may be further controlled with flow control valves 1110. In some embodiments, the exhaust flow of inert gases 219 in the lower inert gases exhaust port 1117 may be adjusted to a high flow rate, to provide a net downward flow. A net downward flow may provide better drawdown of auto-dopants 217 from the wafer gap region 215 through the susceptor vents 520, thus providing further distancing of the auto-dopants 217 from the front side of the substrate 202. A net downward flow may also provide a net downward force on the substrate 202, helping to keep the substrate 202 on the wafer processing structure 200.

Embodiments illustrated in FIGS. 13, 11, 8, and 1A may comprise susceptor arms 1105, which may be attached to a shaft that may permit the susceptor plate 205 and wafer processing structure 200 to move up and down. In embodiments, the up position may be used during the epitaxial deposition, while the down position may be used to permit for transferring the substrate 202. In embodiments, not shown in FIG. 11 for the purpose reducing clutter in the drawing, but illustrated in FIGS. 13, 8 and 1A, may comprise lift fingers 801, which may have lift contacts 803, and which move through lift through holes 802 in the susceptor plate 205, and which are attached to lift arms 101. In embodiments, the lift fingers 801 may separate the substrate 202 from the wafer processing structure 200, so that the substrate 202 may be removed by a robot (not shown) from the chamber 113, and then loaded with another substrate 200 for processing. Epitaxial depositions in the upper section of the processing chamber 113 may have the advantage of better control of process gas flows and temperatures than in the lower section of the processing chamber 113.

Embodiments illustrated in FIGS. 11 and 13 may comprise that the substrate 202 on the positioned wafer support ring 220 may be approximately parallel to the susceptor plate 205. In embodiments, the topside of the susceptor plate 205, which faces the backside of the substrate 202, may be approximately flat. Embodiments may comprise that the spacers 212 are adjustable thereby providing a means for adjusting the thickness of the wafer gap region 215. Embodiments may comprise that the spacers 212 may be detachable from the wafer support ring 220 and may be replaced with different sized spacers 212. In embodiments, the spacer 212 may comprise a protrusion 417, which fits into a slot 213 in the susceptor plate 205. In some embodiments, the susceptor plate 205 may comprise a structure for interlocking with the spacer 212 selected from the group consisting of: a recess, a protrusion, a locking pin, or a combination thereof. In embodiments, the wafer support ring 220 and the spacer 212 may be detachable from the susceptor plate 205. In embodiments, the wafer holder structure 200 may be selected from the group consisting of: a shelf, a bevel, a lip, a protrusion, a finger, or any combination thereof.

Embodiments may comprise a skirt 301 wherein the skirt may comprise vents 518, which permit the flow of an inert gas 218, 219 through the vents 518 into and/or out of the wafer gap region 215. In embodiments, the wafer gap region 215 may have a thickness of about 0.1 inches to about 0.3 inches. Embodiments provide a means for ventilating auto-dopants 217 from the wafer gap region 215 with inert gas 218, wherein the auto-dopants 217 comprise dopants that diffuse out of the backside of the substrate 202 during the epitaxial deposition.

Embodiments may provide the means for ventilating the wafer gap region 215 that may comprise flowing substantial amounts of inert gas 218 through the wafer gap region 215. Flowing substantial amounts of inert gas 218 through the wafer gap region 215 may provide that mixing of inert gas 218 with auto-dopants 217 is the predominant mechanism by which auto-dopants 217 may be removed from the wafer gap region 215. Mixing may be a much more effective means for extracting auto-dopants 217, than by a predominantly diffusive mechanism. Embodiments may provide that the inert gas 218 comprises a gas selected from the group consisting of: hydrogen, nitrogen, helium, neon, argon, krypton, xenon, radon, or any combination thereof.

Figure 12:
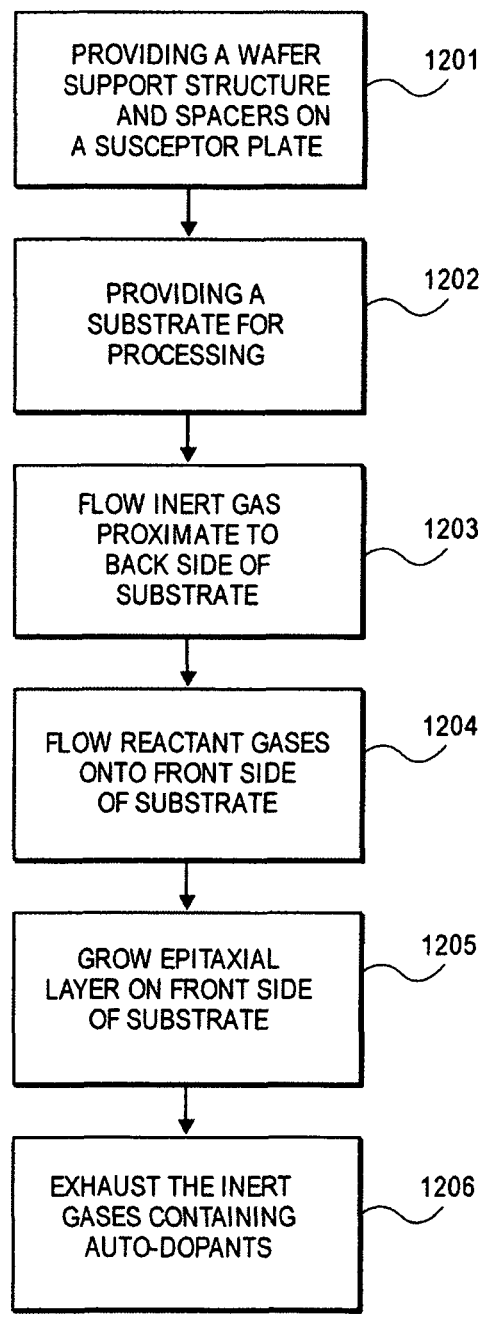
FIG. 12 illustrates a flow chart of embodiments of a method of using the epitaxial deposition apparatus.

Embodiments illustrated in FIGS. 11, 12, and 13 may provide a method of using an epitaxial apparatus 1100, 1300 that supports a substrate 202 above a susceptor plate 205 for depositing an epitaxial layer on the substrate 202, which may comprise providing a spacer 212 and a wafer processing structure 200 onto a susceptor plate 205 in a processing chamber 113 of an epitaxial reactor apparatus 1100, 1201, 1300; wherein the wafer processing structure 200 may comprise a wafer support ring 220 and a wafer holder structure 203 attached to the wafer support ring 220; providing a substrate 202, 1202; wherein the substrate 202 comprises a front side and a backside; wherein the spacer 212 may be in contact with the wafer support ring 220 and positioned on the susceptor plate 205, wherein the spacer 212 may position the wafer support ring 220 above the susceptor plate 205 to provide a wafer gap region 215 between the susceptor plate 205 and the backside of the substrate 202; wherein the backside of the substrate 202 may comprises a heavily doped semiconductor; flowing an inert gas 218 into the processing chamber 113 proximate to the wafer gap region 215 and below the backside of the substrate 202, 1203; flowing reactant gases 221 into the processing chamber 113 onto the front side of the substrate 202, 1204; growing a lightly doped epitaxial semiconductor layer on the front side of the substrate 202 from the reactant gases 221, 1205; and exhausting the inert gas 219 containing auto-dopants 217 out from the wafer gap region 215 and below the top of the wafer processing structure 200 out of the processing chamber 113, 1206.

In embodiments, the reactant gases 221 may comprise a silicon precursor gas used to form a single crystal silicon or single crystal silicon-germanium epitaxial layer. Embodiments of a silicon precursor gas may comprise $SiH_4$ or silane gas. In embodiments, the reactant gases 221 may further comprise a germanium precursor used to form a single crystal silicon-germanium epitaxial layer. Embodiments of a germanium precursor gas may comprise $GeH_4$. In embodiments, the reactant gases 221 may further comprise one or more dopant precursors used to dope the single crystal epitaxial layer. Embodiments of a dopant precursor gas may comprise diborane or borane.

In embodiments, growing the lightly doped epitaxial semiconductor layer may comprise growing a lightly doped single crystal silicon layer or a lightly doped single crystal silicon-germanium layer. In embodiments, the dopant may comprise boron. In embodiments the growth of the single crystal silicon epitaxial layer may occur at a temperature greater than about 950° C. In embodiments, the growing of the single crystal silicon epitaxial layer on the front side of the substrate 202 may occur at a temperature greater than about 1050° C. In embodiments, the growing of the silicon-germanium epitaxial layer on the front side of the substrate 202 may occur at a temperature greater than about 850° C. In embodiments, the growing of the silicon-germanium epitaxial layer may occur at a temperature greater than about 950° C.

Embodiments may further comprise ventilating the wafer gap region 215 with a flow of inert gas 218 while growing the lightly doped epitaxial semiconductor layer on the front side of the substrate 202, thereby removing auto-dopants 217 diffusing out from the backside of the substrate 202, which may substantially reduce the amount of auto-dopants 217 that reach the front side of the substrate 202. Embodiments may comprise reducing the concentration of auto-dopants 217 incorporated into the lightly doped epitaxial semiconductor layer on the front side of the substrate 202.

Embodiments may further comprise rotating the susceptor plate 205, the wafer processing structure 200, and the substrate 202. Embodiments may comprise rotating the susceptor plate 205, the wafer processing structure 200, and the substrate 202, at a rotational speed of about 3 rpm to about 300 rpm. An embodiment may comprise rotating the substrate 202 at a rotational speed of about 20 rpm to about 60 rpm.

In embodiments, the ventilating of the wafer gap region 215 may further comprise adjusting the flow of inert gas 218 to improve ventilation and reduce the risk of contaminating the epitaxial layer with auto-dopants 217 and reduce the risk of depositing epitaxial material on the backside of the substrate 202. In embodiments, adjusting the flow of inert gas 218 further comprises adjusting the thickness of the wafer gap region 215 by adjusting the height of the spacers 212. In embodiments, the thickness of the wafer gap region 215 may be selected to be thick enough to substantially reduce auto-doping but not too thick to substantially degrade temperature uniformity, thereby degrading the thickness uniformity of the deposited epitaxial layer formed on the front side of the substrate 202. Substantial reductions in auto-doping and substantial improvements in thickness uniformity, may result in higher resistivities and improved quality of the epitaxial layer, which may provide improved performance and potential for new applications for devices, for example, semiconductor devices, manufactured on such epitaxial layers. In embodiments, the wafer gap region 215 may have a thickness of about 0.1 inches to about 0.3 inches. Embodiments for adjusting the flow of inert gas 218 may further comprises the methods selected from the group consisting of: adjusting gap size, adjusting skirt length, adjusting the number, size, and positions of vents, adjusting the speed of rotation of the wafer processing structure 200, adjusting the positions of injection and exhaust ports, adjusting the flow rates of injected inert gas 218, adjusting the flow rates of exhaust inert gas 219, adjusting the flow rates of injected reactant gases 221, adjusting the flow rates of exhaust reacted gases 222, and any combination thereof.

In embodiments, the inert gas may comprise a gas selected from the group consisting of: hydrogen, nitrogen, helium, neon, argon, krypton, xenon, radon, or any combination thereof. The inert gas may comprise any gas that would not interact with or interfere with the reactions occurring in the processing chamber. In embodiments, the wafer processing structure 200 and the spacers 212 may provide a means for separating and isolating reactant gas 221 flow patterns on the front side of the substrate from inert gas 218 flow patterns on the backside of the substrate 202. In embodiments, the flow of inert gas 218 may further comprise a pre-curser flow prior to the epitaxial deposition and a processing flow during the epitaxial deposition. In embodiments, the pre-curser flow may be about 2 l/min to about 40 l/min. Sufficient pre-curser flow may be effective in removing residual auto-dopants 217 from the previously processed substrate 202. In embodiments, the processing flow may be about 20 l/min to about 180 l/min. Sufficient processing flow may be effective in maintaining a low concentration of auto-dopants 217 in the wafer gap region 215.

In embodiments, the flowing of reactant gases 221 onto the front side of the substrate 202 may further comprise flowing reactant gases 221 through multiple or adjustable injection ports. The use of multiple or adjustable injection ports may be effective in improving both resistivity and thickness uniformity. In embodiments, the flowing of reactant gases 221 onto the front side of the substrate 202 through multiple or adjustable injection ports may further comprise providing extra dopant in the center of the substrate 202.

In embodiments, the heavily doped semiconductor on the backside of the substrate 202 may comprise boron. In embodiments, the heavily doped semiconductor on the backside of the substrate 202 may have a resistivity less than about 100 milliohms/sq. In embodiments, the lightly doped epitaxial semiconductor on the front side of the substrate 202 may have a resistivity between about 5 ohms/sq. to about 150 ohms/sq. In embodiments, the growing of the epitaxial layer on the front side of the substrate 202 may occur at a temperature greater than about 950° C. In embodiments, the growing of the epitaxial layer on the front side of the substrate 202 may occur at a temperature greater than about 1050° C. Deposition rates may increase with the deposition temperature, but so may diffusion of auto-dopants 217 from the backside of the substrate 202. Therefore, providing the means to reduce auto-doping provides the ability to increase process temperatures, and thus, may increase apparatus 1300 throughput.

Embodiments may further comprise a computer with instructions, which may be stored on a computer readable medium, to facilitate the control of embodiments of processes for a method of using various embodiments of reduced auto-doping epitaxial apparatus 1300. The instructions to control processes may comprise main process control instructions. In embodiments, the main process control instructions may comprise instructions to control the flow rates and/or flow patterns of injected inert gas 218 and/or injected reactant gases 221. In embodiments, the main process control instructions may further comprise instructions to control the flow rates and/or flow patterns of exhaust inert gases 219 and/or exhaust reacted gases 222. In embodiments, the main process control instructions may further comprise instructions to control the composition of the injected reactant gases 221, which may further comprise control of one or more of the flow rates of individual constituents of the injected reactant gases 221.

In embodiments, the main process control instructions may further comprise instructions to control the distribution and concentration of dopants in the reactant gases 221 flowing over the surface of the front side of the substrate 202. In embodiments, the main process control instructions may further comprise instructions to control the flow rates and/or flow patterns of one or both of the pre-curser flow and the processing flow of injected inert gas 218. In embodiments, the main process control instructions may further comprise instructions to control the ventilation of the wafer gap region 215.

In embodiments, the main process control instructions may further comprise instructions to control the processing temperatures, and/or ramp-up temperature profiles, and/or cool-down temperature profiles, and/or temperature uniformity across the substrate. In embodiments, the main process control instructions may further comprise instructions to control the rotational speeds of the substrate being processed. Embodiments may comprise rotational speed profiles before, and/or during, and/or after the epitaxial growth process.

Embodiments illustrated in FIGS. 11 and 13 may provide for an apparatus 1100, 1300 for reducing auto-doping of the front side of a substrate 202 and defects on the backside of the substrate 202 during an epitaxial deposition process. Embodiments may comprise: a means for forming a wafer gap region 215 having an adjustable thickness, wherein the wafer gap region 215 may comprise a region between the backside of the substrate 202 and a susceptor plate 205; a means for ventilating auto-dopants 217 out of the wafer gap region 215 with a flow of inert gas 218, while inhibiting or prohibiting the flow of inert gas 218 over the front side of the substrate 202; and a means for flowing reactant gases 221 over the surface of the front side of the substrate 202, while inhibiting or prohibiting the flow of reactant gases 221 near the surface of the backside of the substrate 202.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An apparatus for supporting a substrate above a susceptor plate comprising:
    a wafer processing structure for supporting a substrate;
    wherein the substrate comprises a front side and a backside;
    wherein the wafer processing structure comprises:
        a wafer support ring; and
        a wafer holder structure attached to the wafer support ring, wherein the wafer holder structure supports the substrate in a position for processing; and
    a spacer in contact with the wafer support ring and positioned on top of a susceptor plate, wherein the spacer positions the wafer support ring above the susceptor plate to provide a wafer gap region between the susceptor plate and the backside of the substrate and wherein the spacer is adjustable to adjust the thickness of the wafer gap region.

2. The apparatus of claim 1, wherein an inert gas is capable of flowing through the wafer gap region so as to ventilate auto-dopants from the wafer gap region, wherein auto-dopants comprise dopants that diffuse out of the backside of the substrate during a high temperature process.

3. The apparatus of claim 2, wherein the high temperature process comprises an epitaxial deposition.

4. The apparatus of claim 2, wherein the inert gas comprises a gas selected from the group consisting of: hydrogen, nitrogen, helium, neon, argon, krypton, xenon, radon, or any combination thereof.

5. The apparatus of claim 1, wherein the wafer holder structure is selected from the group consisting of: a shelf, a bevel, a lip, a protrusion, a finger, or any combination thereof.

6. The apparatus of claim 1, wherein the wafer holder structure supports the substrate at the edges of the substrate.

7. The apparatus of claim 1, wherein the positioned wafer support ring supports a substrate that is approximately parallel to the susceptor plate.

8. The apparatus of claim 1, wherein the wafer support ring, wafer holder structure, and spacer comprise one or more materials selected from a group consisting of: silicon carbide, quartz, graphite, silicon nitride, aluminum nitride, or any combination thereof.

9. The apparatus of claim 1, wherein the thickness of the walls of the wafer support ring are between about 0.002 inches to about 0.3 inches.

10. The apparatus of claim 1, wherein the spacer is detachable from the wafer support ring and replaceable with a different sized spacer.

11. The apparatus of claim 10, wherein the spacer comprises a stand-off pin.

12. The apparatus of claim 11, wherein the stand-off pin comprises a protrusion, which fits into a slot in the susceptor plate.

13. The apparatus of claim 1, wherein the spacer comprises one or more spacer rings, which are stackable, and comprise vents, which permit the flow of an inert gas through the vents into and/or out of the wafer gap region.

14. The apparatus of claim 13, wherein the one or more stackable spacer rings interlock with each other and with the susceptor plate and the wafer support ring.

15. The apparatus of claim 1, further comprising a skirt attached to the wafer support ring and extends down toward the susceptor plate, wherein the flow of an inert gas into and/or out of the wafer gap region is controlled by the skirt.

16. The apparatus of claim 15, wherein the skirt comprises a ring having a vertical wall along the circumference of the wafer support ring.

17. The apparatus of claim 16, wherein the skirt comprises vents, which permit the flow of an inert gas through the vents into and/or out of the wafer gap region.

18. The apparatus of claim 1, wherein the topside of the susceptor plate, which faces the backside of the substrate, is approximately flat.

19. The apparatus of claim 1, wherein the wafer gap region has a thickness of about 0.1 inches to about 0.3 inches.

20. The apparatus of claim 1, wherein the wafer processing structure is slightly inclined with respect to the susceptor plate, wherein the substrate held by the wafer processing structure is slightly lower on an injection side and slightly higher on an exhaust side.

21. The apparatus of claim 1, wherein the wafer support ring and the spacer are detachable from the susceptor plate.

22. An apparatus for depositing an epitaxial layer on a substrate comprising:
    a processing chamber;
    a susceptor plate within the processing chamber;
    a wafer processing structure for supporting a substrate over the susceptor plate;
    wherein the substrate comprises a front side and a backside;

wherein the wafer processing structure comprises:
a wafer support ring; and
a wafer holder structure attached to the wafer support ring;
a spacer in contact with the wafer support ring and positioned on top of the susceptor plate, wherein the spacer positions the wafer support ring above the susceptor plate to provide a wafer gap region between the susceptor plate and the backside of the substrate and wherein the spacer is adjustable to adjust the thickness of the wafer gap region;
an upper injection manifold for providing reactant gases onto the front side of the substrate;
a lower injection manifold for providing an inert gas into the processing chamber proximate to the wafer gap region; and
a lower exhaust manifold for removing exhaust gases containing auto-dopants from the processing chamber.

23. The apparatus of claim 22, wherein the inert gas comprises any gas or combination of gases that would not interact with or interfere with the reactions occurring in the processing chamber.

24. The apparatus of claim 22, wherein the topside of the susceptor plate, which faces the backside of the substrate, is approximately flat.

25. The apparatus of claim 22, wherein the substrate on the positioned wafer support ring is approximately parallel to the susceptor plate.

26. The apparatus of claim 22, wherein the susceptor plate comprises a material selected from a group consisting of: silicon carbide, graphite, aluminum nitride, other ceramics, or any combination thereof.

27. The apparatus of claim 22, wherein the wafer holder structure is selected from the group consisting of: a shelf, a bevel, a lip, a protrusion, a finger, or any combination thereof; and
wherein the wafer support ring and the spacer are detachable from the susceptor plate.

28. The apparatus of claim 22, further comprises an upper reacted gases exhaust port for removing reacted gases and residual reactant gases from the region over the front side of the substrate.

29. The apparatus of claim 28, wherein the upper and lower injection manifolds and the upper and lower exhaust ports provide a means for separating and isolating reactant gas flow patterns on the front side of the substrate from inert gas flow patterns on the backside of the substrate.

30. The apparatus of claim 22, providing a means for ventilating auto-dopants from the wafer gap region with inert gas, wherein auto-dopants comprise dopants that diffuse out of the backside of the substrate during the epitaxial deposition.

31. The apparatus of claim 30, wherein the means for ventilating comprises flowing substantial amounts of inert gas through the wafer gap region.

32. The apparatus of claim 22, wherein the susceptor plate comprises susceptor vents.

33. The apparatus of claim 32, wherein the susceptor vents range from about 1/8 to about 1/4 of an inch.

34. The apparatus of claim 22, wherein the susceptor plate comprises a porous material structure.

35. The apparatus of claim 22, wherein the susceptor plate comprises a ventilated structure, wherein the ventilated structure provides substantial flow out of the wafer gap region.

36. The apparatus of claim 22, wherein the susceptor plate comprises a structure for interlocking with the spacer selected from the group consisting of: a recess, a protrusion, a locking pin, or a combination thereof.

37. The apparatus of claim 22, further comprising a skirt attached to the wafer support ring and extends down toward the susceptor plate, wherein the flow of an inert gas into and/or out of the wafer gap region is controlled by the skirt.

38. The apparatus of claim 37, wherein the wafer processing structure further comprises a shelf extension positioned between and attached to the wafer support ring and the wafer holder structure.

39. The apparatus of claim 22, wherein the upper injection manifold further comprises a showerhead of inlets and/or outlets over the front side of the substrate.

40. An apparatus for reducing auto-doping of the front side of a substrate and defects on the backside of the substrate during an epitaxial deposition process for depositing an epitaxial layer on the front side of the substrate comprising:
a means for forming a wafer gap region having an adjustable thickness, wherein the wafer gap region comprises a region between the backside of the substrate and a susceptor plate;
a means for ventilating auto-dopants out of the wafer gap region with a flow of inert gas, while inhibiting or prohibiting the flow of inert gas over the front side of the substrate; and
a means for flowing reactant gases over the surface of the front side of the substrate, while inhibiting or prohibiting the flow of reactant gases near the surface of the backside of the substrate.

* * * * *